United States Patent [19]

Adachi et al.

[11] Patent Number: 5,086,230
[45] Date of Patent: Feb. 4, 1992

[54] APPARATUS FOR FORMING, CORRECTING PATTERN

[75] Inventors: Tatsuya Adachi; Masahiro Yamamoto, both of Tokyo, Japan

[73] Assignee: Seiko Instruments & Electronics Ltd., Japan

[21] Appl. No.: 244,128

[22] Filed: Sep. 14, 1988

Related U.S. Application Data

[63] Continuation of Ser. No. 855,167, Apr. 23, 1986, abandoned.

[30] Foreign Application Priority Data

Apr. 23, 1985 [JP] Japan ............................ 60-87275
Apr. 23, 1985 [JP] Japan ............................ 60-87276

[51] Int. Cl.$^5$ .............................................. H01J 37/317
[52] U.S. Cl. ................................... 250/492.2; 250/398; 250/309
[58] Field of Search ............... 250/492.21, 492.2, 398, 250/309; 430/5; 428/43.1

[56] References Cited

U.S. PATENT DOCUMENTS 4,605,566  8/1986  Matsui et al. ................... 427/43.1

FOREIGN PATENT DOCUMENTS 58-6133  1/1983  Japan .

OTHER PUBLICATIONS

Gamo et al., Extended Abstracts of the 16th (1948) International Conference on Solid State Devices and Materials, 1984, pp. 31-34.

*Primary Examiner*—Jack I. Berman
*Attorney, Agent, or Firm*—Bruce L. Adams; Van C. Wilks

[57] ABSTRACT

A means is employed to blow a gas for forming a conductive film and a gas for forming an insulating film onto the surface of a specimen while it is being irradiated with an ion beam, in order to easily and quickly form a small conductive pattern and an insulating pattern in a laminated manner, and a means is employed to cut a pattern by the irradiation with an ion beam and to form a new electrically conductive pattern by blowing a gas while the pattern is being irradiated with the ion beam in order to accomplish an electric connection between the patterns, making it possible to locally cut or connect tiny patterns.

6 Claims, 4 Drawing Sheets

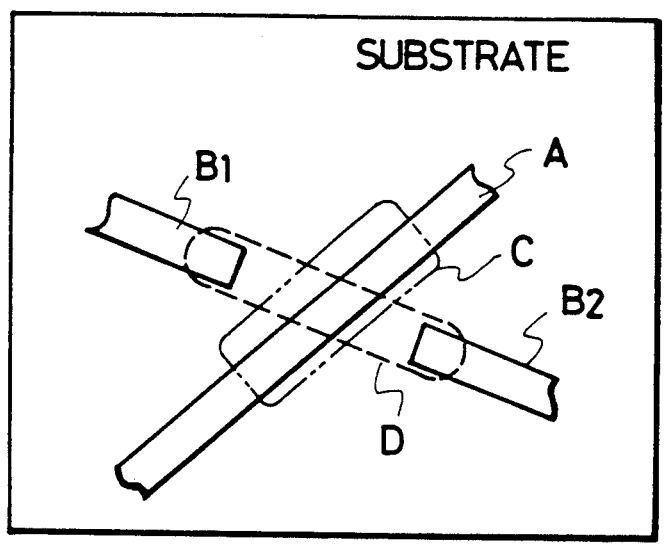
F I G. 2

SUBSTRATE

10µ

SUBSTRATE

10µ

APPARATUS FOR FORMING, CORRECTING PATTERN

This is a continuation of application Ser. No. 855,167, filed April 23, 1986 now abandoned.

BACKGROUND OF THE INVENTION

The present invention relates generally to an apparatus for forming patterns and for correcting patterns, and more particularly to an apparatus for forming patterns by directing a gas for forming a conductive film and a gas for forming an insulating film successively onto the surface of a specimen while it is being irradiated with an ion beam so that the conductive pattern and the insulating pattern are formed in a laminated manner, and to an apparatus for correcting patterns by cutting a tiny circuit pattern such as a wiring pattern which constitutes semiconductor elements by the irradiation with an ion beam, and electric by forming a new electrically conductive pattern by blowing a gas while the pattern is being irradiated with the ion beam.

When wiring patterns are to be electrically connected to each other so as to span across a very small wiring pattern (of the order of microns) after the elements such as LSI's have been formed, it is desired to form a pattern consisting of a thin film of an insulating material on a portion of the wiring patterns to be spanned by a conductive film pattern and to form a pattern consisting of a conductive thin film on the thus formed pattern of thin insulating film in a crossing manner to accomplish the electric connection between the wiring patterns. It has also been desired to form a pattern of a thin insulating film on a silicon substrate or on a pattern of a thin conductive film, and to form a conductive pattern on the thus formed pattern of thin insulating film, in order to form tiny elements such as capacitors, microstrip lines and dielectric resonators at given places at given moments, or in order to adjust the characteristics of the elements.

When a variety of characteristics are to be measured for each of the desired blocks after the elements such as LSI's have been formed, it is desired to cut wirings in order to separate each block from the other blocks. It has also been attempted to measure the characteristics for each of the elements or blocks independently from each other and, then, electrically connect the thus measured elements or blocks to measure the total characteristics of the system as a whole. It has further been attempted to connect together those elements or blocks that exhibit good characteristics, in order to increase the yields.

So far, however, it has not been easy to form the conductive pattern and the insulating pattern at desired places at desired moments quickly and in a laminated manner after the pattern has been completed such as in an LSI or after a custom IC has been completed, while maintaining precision an the order of microns and often in the order of submicrons.

Apparatuses have heretofore been proposed to cut off portions (black defects) where chromium is adhered excessively in a photomask by using a laser beam, or to adhere chromium on portions (white defects) that are missing in the photomask by using the laser beam in a gaseous atmosphere. In directly cutting the wiring pattern of the order of submicrons or in directly connecting the wiring pattern of the order of submicrons by using such apparatuses, however, limitation is inevitably imposed on a minimum size that can be corrected due to the inherent properties of light. Moreover, it is difficult to remove, for instance, a transparent film by using such apparatuses.

SUMMARY OF THE INVENTION

It is an object of the invention to easily and quickly form a small conductive pattern and insulating pattern in a laminated manner. Another object of the invention is to accomplish an electric connection between the patterns, making it possible to locally cut or connect tiny patterns.

These objects together with others not specifically mentioned will become clear to those skilled in the art from the following description.

BRIEF DESCRIPTION OF THE DRAWINGS

FIG. 2 is a diagram showing an example of a sample specimen treated by the structure of the embodiment of the present invention shown in FIG. 1.

DETAILED DESCRIPTION OF THE INVENTION

Embodiments of the present invention will now be described in detail in conjunction with the drawings.

Figure 1:
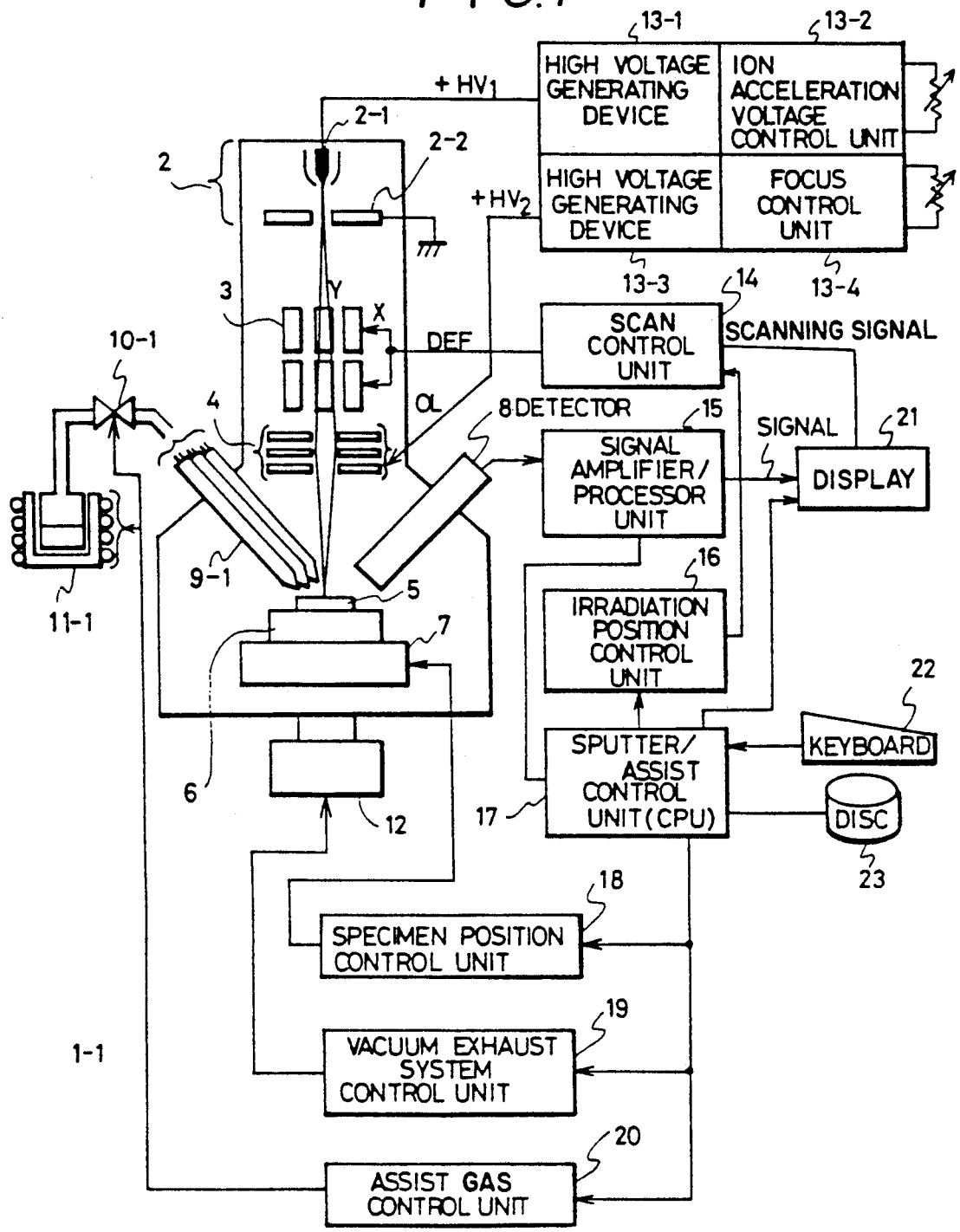
FIG. 1 is a diagram showing the structure according to an embodiment of the present invention.

FIG. 1 is a diagram showing the structure according to an embodiment of the present invention, and FIG. 2 is a diagram showing the structure of the embodiment of the invention shown in FIG. 1.

In the drawings, reference numeral 1-1 denotes an apparatus for forming and correcting patterns, especially for forming, according to the present invention, 2 denotes an ion gun, 2-1 denotes an ion source, 2-2 denotes an electrode, 3 denotes deflecting electrodes (DEF), 4 denotes an object lens, 5 denotes a specimen, 6 denotes a specimen plate, 7 denotes a specimen moving mechanism, 8 denotes a detector, 9-1 denotes a gas gun for blowing assist gases, 10-1 denotes needle valves, 11-1 denotes gas sources, 12 denotes a vacuum exhaust device, 13-1 and 13-3 denote high voltage generating devices, 13-2 denotes an ion acceleration voltage control unit, 13-4 denotes a focus control unit, 14 denotes a scan control unit, 15 denotes a signal amplifier/processor unit, 16 denotes an irradiation position control unit, 17 denotes a sputter/assist control unit, 18 denotes a specimen position control unit, 19 denotes a vacuum exhaust system control unit, 20 denotes as assist gas control unit, 21 denotes a display, 22 denotes a keyboard, and 23 denotes a disc.

First, a description will be given of the use and operation of the apparatus in the case when charged particles, such as secondary electrons emitted from the specimen being irradiated with the ion beam, are displayed as an SIM image on the display 21. During the imaging phase of operation, the scan control unit 14 operates in a first mode to effect scanning of the specimen so as to form an image of the specimen on the display 21.

In the ion gun shown in FIG. 1, a high voltage $+HV_1$ of positive polarity is applied from the high voltage generating device 13-1 to the ion source 2-1, such as a needle which has a sharp end and which contains gallium with respect to the electrode 2-2 that has a hole formed on the axis thereof and that is grounded, and the ion source 2-1 is heated to such a degree that liquid gallium forms at the end thereof so that a particle beam of gallium ions is emitted. The acceleration voltage for accelerating the beam of gallium ions is set by the ion acceleration voltage control unit 13-2. The emitted particle beam of gallium ions is finely focused by an object lens (OL) 4 to form an image upon the specimen 5 mounted on the specimen plate 6, and is deflected by the deflecting electrodes (X and Y) to scan the specimen 5. The secondary electrons emitted from the specimen 5 are detected by the detector 8, and are supplied to the signal amplifier unit 15. A high voltage generated by the high voltage generating device 13-3 is applied to the object lens 4 responsive to a signal from the focus control unit 13-4, and a beam of gallium ions, which is finely focused, falls on the specimen 5.

The signals supplied to the signal amplifier/processor unit 15 are amplified and processed, and are displayed on the display 21 as an SIM image. The magnification of the SIM image that is displayed is determined by the intensity of the scanning signals that are applied by the scan control unit 14 to the deflecting electrodes 3. The position of the specimen 5 observed on the display 21 is determined by the specimen moving mechanism 7 which moves the specimen plate 6 responsive to instruction signals from the specimen position control unit 18, or which moves the specimen plate 6 via a manual mechanism that is not shown. The interior of the specimen chamber which constitutes the pattern forming and correcting device 1-1, and the region where the beam of gallium ions passes, are evacuated to a high degree of vacuum by the vacuum exhaust device 12 responsive to an instruction signal from the vacuum exhaust system control unit 19.

Owing to the above-mentioned structure and operation, the SIM image of the specimen 5 can be observed, and the positions for laminating the conductive pattern and the insulating pattern can be correctly determined as will be described later.

Second, a description will be given of the use and operation of the apparatus in the case when a conductive pattern and an insulating pattern are to be newly formed in a laminated manner. During the treatment phase of operation, the scan control unit 14 operates in a second mode to repeatedly scan a selected designated treatment area of the specimen surface to effect the desired treatment.

As described above, the specimen plate 6 is so moved that the region which includes a pattern to be newly formed is displayed on the display 21 as an SIM image, and the focus of the object lens 4 is adjusted. The specimen plate 6 may be moved by storing in advance the data such as position coordinates of the pattern on the LSI as a data base in the disc 23, and by inputting the position data and size of a pattern to be newly formed to the sputter/assist control unit 17 through the keyboard 22. Or, the specimen plate 6 may be manually moved.

The data are then input from the keyboard 22 to the sputter/assist control unit 17, so that the beam of gallium ions will correctly scan in a second scanning mode for a predetermined period of time the region where a pattern is to be newly formed in the pattern that is displayed on the display 21. The sputter/assist control unit 17 gives instruction to the irradiation position control unit 16 responsive to the keyed input data. The irradiation position control unit 16 which has received the instruction sends a control signal to the scan control unit 14 so that a predetermined scanning voltage is applied to the deflecting electrodes 3 in the second scanning mode.

In order to form a new conductive pattern or a new insulating pattern, furthermore, the sputter/assist control unit 17 sends an instruction signal to the assist gas control unit 20. A gas such as pyrene ($C_{16}H_{10}$) gas which is generated by heating one of the gas sources 11-1 and which forms, for example, a thin conductive film, it blown, through any one of a plurality of nozzles constituting the gas gun 9-1 via needle valve 10-1 and directed onto the specimen at a position on which the gallium ion beam is irrodiated. The pyrene gas is decomposed by the gallium ion beam into electrically conductive carbon having a strong adhering force, and the film of this carbon is formed on the region that is scanned by the beam of gallium ions. Similarly, an $SiH_4$—$NH_3$ gas is blown from another nozzle and directed onto the surface of the specimen 5 which is irradiated with the beam of gallium ions, so that an electrically insulating silicon oxide ($SiO_2$) film is formed on the region that is scanned by the beam of gallium ions.

As described above, the electrically conductive pattern and the insulating pattern are successively formed in a laminated manner.

Needle valves 10-1 (the drawing shows only one needle valve) provided for each of the plurality of nozzles that constitute the gas gun 9-1 are closed when the assist gases are not supplied from the gas sources 11 to the plurality of nozzles that constitute the gas gun 9-1.

When a conductive pattern is to be formed, in general, the gas source 11 is heated so as to supply, for example, the pyrene gas only as described above, and the gas generated from the gas source 11 is directed through a predetermined nozzle of the gas gun 9-1 onto the surface of the specimen 5 that is irradiated with the beam of gallium ions. In order to direct the gas onto the surface of the specimen 5, in this case, a predetermined needle valve 10-1 only is opened. As required, furthermore, the needle valves 10-1 functions to control the amount of the gas. As a gas directed onto the specimens for forming an electrically conductive pattern, furthermore, it is also possible to use a molybdenum compound gas, an aluminum compound gas or a chromium compound gas, instead of the pyrene gas, from a predetermined nozzle of the gas gun 9-1 onto the position on which the gallium ion beam is falling, in order to form a new conductive pattern of an electrically conductive substance maintaining a size of the order of submicrons. By successively forming the conductive patterns and the insulating patterns in a laminating manner, the aforementioned elements such as capacitors, microstrip lines and the like can be formed at any desired location and at any moment.

Described below in detail with reference to FIG. 2 is the operation of the apparatus in the case when the electrically conductive pattern and the insulating pattern are formed in a laminated manner.

FIG. 2 illustrates an example where an insulating pattern C and a conductive pattern D are formed to electrically connect a wiring pattern $B_1$ and a wiring pattern $B_2$ together spanning across a wiring pattern A which constitutes an LSI.

First, in order to form the insulating pattern C as indicated by a two-dot chain line on the wiring pattern A, a region for forming the insulating pattern C is displayed on the display 21 of FIG. 1 in a manner as described above. From the keyboard 22 to the sputter/assist control unit 17 are input data related to the region for forming the insulating pattern C, data related to the assist gas for specifying a gas to form the insulating pattern C, and data related to the thickness of the film of the insulating pattern C. Thereafter, the sputter/assist control unit 17 sends instruction to the irradiation position control unit 16 and to the assist gas control unit 20 as described above, to so control the scanning signals so that the gallium ion beam scans the region where the above specified insulating pattern C will be formed, and so that an $SiH_4$—$NH_3$ gas for forming the insulating pattern C will be directed onto a position where the gallium ion beam is falling. With the gallium ion beam being irradiated for a predetermined period of time, the insulating pattern C having a predetermined film thickness is formed as indicated by the two-dot chain line.

Second, the electrically conductive pattern D indicated by a dotted line is formed to electrically connect the wiring pattern $B_1$ and the wiring pattern $B_2$ together in a manner to span across the insulating pattern C that was formed in the first step. Like in the case of the first step, data related to the assist gas for specifying the gas that forms the conductive pattern C and data related to the film thickness of the conductive pattern are input from the keyboard 22. As described above, the sputter/assist control unit 17 then sends instruction to the irradiation position control unit 16 and to the assist gas control unit 20 to so control the scanning signals so that the gallium ion beam will scan the region where the above specified conductive pattern D is to be formed, and so that the pyrene gas for forming the conductive pattern D will be directed onto a position where the gallium ion beam is falling. After being irradiated with the gallium ion beam for a predetermined period of time, there is formed the conductive pattern having a predetermined film thickness as shown.

With the conductive pattern D being formed on the insulating pattern C in a crossing manner as described above, it is possible to electrically connect the wiring pattern $B_1$ and the wiring pattern $B_2$ in a size of the order of submicrons easily and quickly by spanning across the wiring pattern A such as an LSI that has been completed already.

Further, by forming an insulating pattern on the conductive pattern in the same manner as mentioned above and by further forming a conductive pattern on the insulating pattern in a laminated manner, a capacitor can be formed at any place at any moment and in any size of the order of submicrons. It is easy to repair the wiring patterns that are formed in sizes of the order of microns or even sizes of the order of submicrons, or to disconnect a defective element and connect another spare element. For example, when wiring patterns for driving a liquid crystal panel arranged in the form of dots used as a display are to be repaired, or when a defective drive element is to be disconnected from the wiring pattern and another spare drive element is to be connected, the electric connection can be accomplished in a manner to span across other wirings.

According to the present invention as described above (FIGS. 1, 2), means is employed to successively direct a gas that forms a conductive film and a gas that forms an insulating film onto the surface of the specimen at a predetermined location while it is being irradiated with an ion beam, making it possible to form a very small electrically conductive pattern and an insulating pattern in a laminated manner. In particular, it is made possible to electrically connect the wiring patterns together spanning across the wiring pattern that has been completed already, such as an LSI, in sizes of the order of microns and often of the order of submicrons. Furthermore, it is allowed to form a very small capacitor at any time at any place in any size of the order of microns.

Another embodiment of the present invention will be described in detail in conjunction with FIGS. 3–5.

Figure 3:
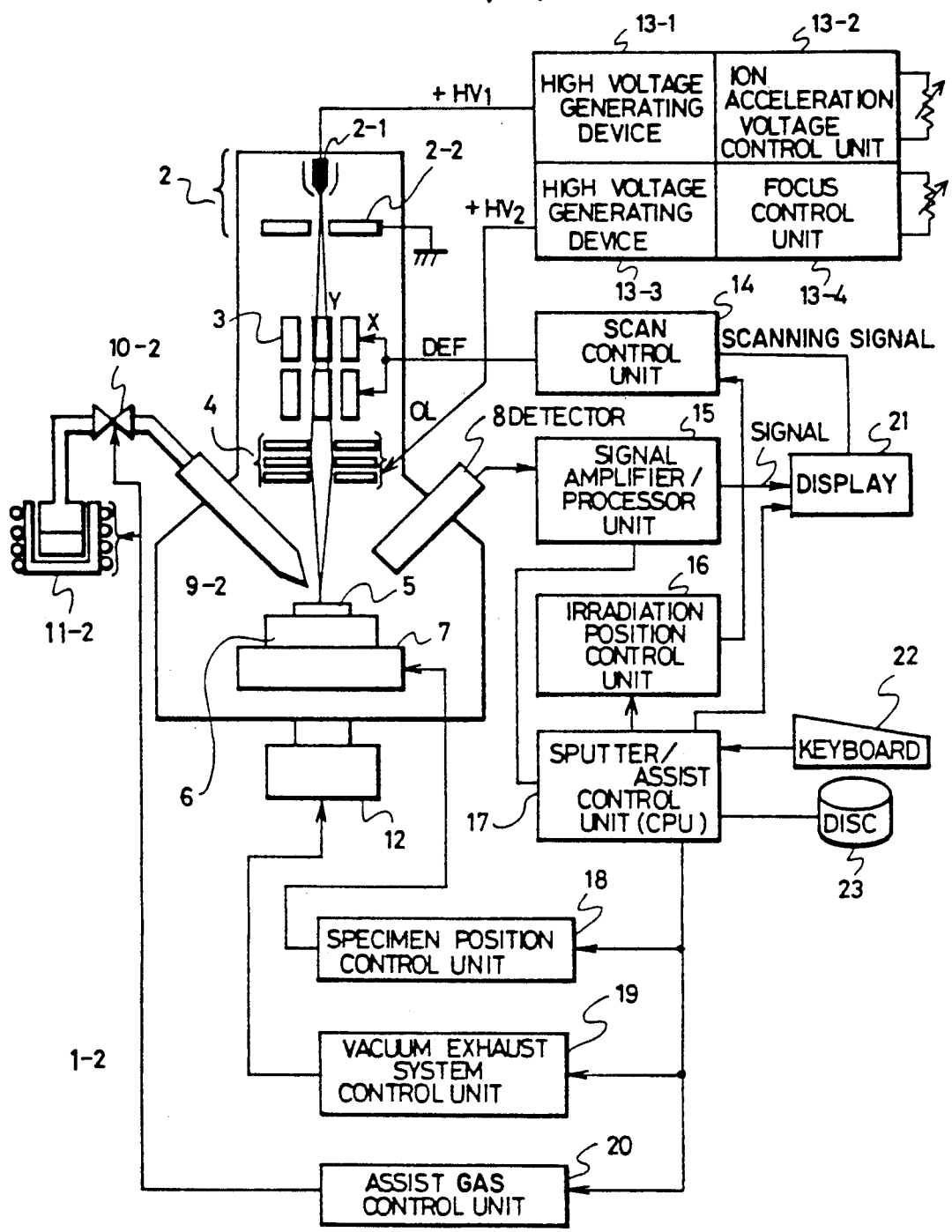
FIG. 3 is a diagram showing the structure according to another embodiment of the present invention.
Figure 4:
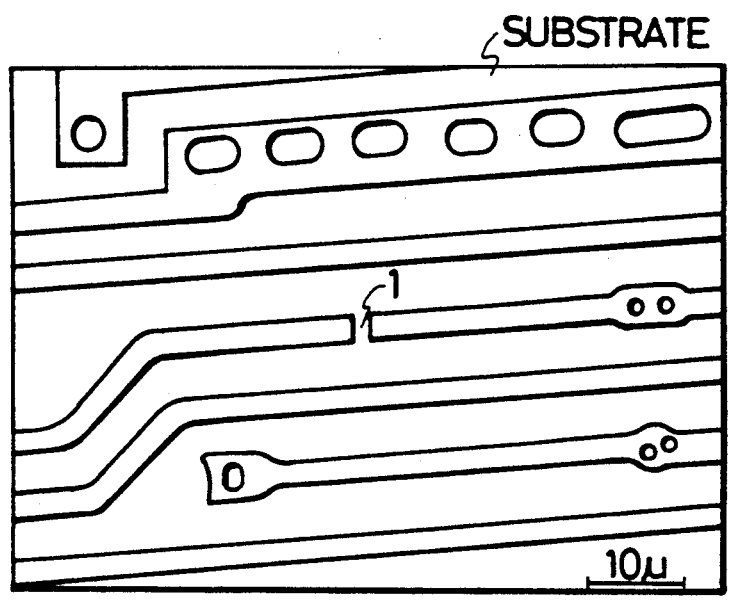
FIGS. 4 and 5 are diagrams showing examples of sample specimens treated by the structure of the embodiment of the present invention shown in FIG. 3.
Figure 5:
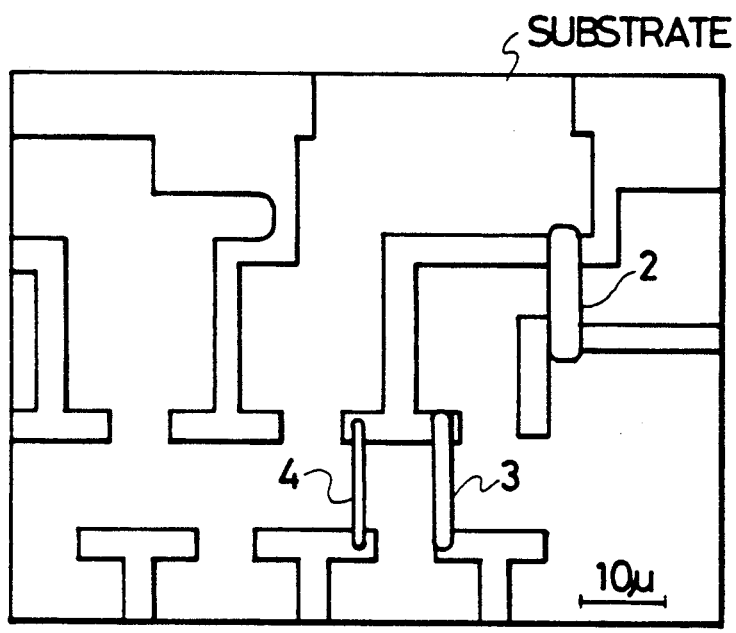

FIG. 3 is a diagram showing the structure according to an embodiment of the present invention, and FIGS. 4 and 5 are diagrams showing sample specimens treated by the structure of the embodiment of the invention shown in FIG. 3. In the drawings, reference numeral 1-2 denotes an apparatus for forming and correcting patterns, especially for correcting, according to the present invention, 9-2 denotes a gas gun for blowing an assist gas, 10-2 denotes a needle valve, 11-2 denotes a gas source, and the other reference numeral correspond to the numerals shown in FIG. 1.

First, a description will be given of the use and operation of the apparatus in the case when charged particles, such as secondary electrons emitted from the specimen 5 that is irradiated with the ion beam, are displayed as an SIM image on the display 21. During the imaging phase of operation, the scan control unit 14 operates in a first mode to effect scanning of the specimen so as to form an image of the specimen on the display 21.

In the ion gun 2 shown in FIG. 3, a high voltage $+HV_1$ of positive polarity is applied from the high voltage generating device 13-1 to the ion source 2-1, such as a needle which has a sharp end and which contains gallium, with respect to the electrode 2-2 that has a hole formed on the axis thereof and that is grounded, and the ion source 2-1 is heated to such a degree that liquid gallium forms at the end thereof so that a particle beam of gallium ions is emitted. The acceleration voltage for accelerating the beam of gallium ions is set by the ion acceleration voltage control unit 13-2. The emitted beam of gallium ions is finely focused by an object lens (OL) 4 to form an image upon the specimen 5 mounted on the specimen plate 6, and is deflected by the deflecting electrodes (X and Y) to scan the specimen 5. The secondary electrons emitted from the specimen 5 are detected by the detector 8, and are supplied to the signal amplifier unit 15. A high voltage generated by the high voltage generating device 13-3 is applied to the object lens 4 responsive to a signal from the focus control unit 13-4, and a particle beam of gallium ions, which is finely focused, falls on the specimen 5.

The signals supplied to the signal amplifier/processor unit 15 are amplified and processed, and are displayed on the display 21 as an SIM image. The magnification of the SIM image that is displayed is determined by the intensity of the scanning signals that are applied by the scan control unit 14 to the deflecting electrodes 3. The position of the specimen 5 observed on the display 21 is determined by the specimen moving mechanism 7 which moves the specimen plate 6 responsive to instruction signals from the specimen position control unit 18, or which moves the specimen plate 6 via a manual mechanism that is not shown. The interior of the specimen chamber which constitutes the pattern correcting device 1, and the region where the beam of gallium ions passes, are evacuated to a high degree of vacuum by the vacuum exhaust device 12 reponsive to an instruction signal from the vacuum exhaust system control unit 19.

Owing to the above-mentioned structure and operation, the SIM image of the specimen 5 can be observed, and the positions for cutting and connecting the pattern can be determined as will be described later.

Second, a description will be given of the use and operation of the apparatus in the case when the pattern is to be cut by sputtering. During the treatment phase of operation, the scan control unit 14 operates in a second mode to repeatedly scan a selected designated treatment area of the specimen surface to effect the desired treatment.

As described above, the specimen plate 6 is so moved that the pattern to be cut is displayed as an SIM image on the display 21, and the focus of the object lens 4 is adjusted. The specimen plate 6 may be moved by storing in advance the position coordinates and sizes of the pattern such as an LSI as a data base in the disc 23, and by inputting the position data to be cut to the sputter/assist control unit 17 through a keyboard 22. Or, the specimen plate 6 may be manually moved. The sputter/assist control unit 17 gives instruction to the irradiation position control unit 16 responsive to keyed input data from the keyboard 22, such that the beam of gallium ions correctly scans, in a second scanning mode, the region that is to be cut in the pattern displayed on the display 21 for a predetermined period of time to sputter (cut) it. The irradiation position control unit 16 which has received the instruction sends a control signal to the scan control unit 14 so that a predetermined scanning voltage is applied to the deflecting electrodes 3 in the second scanning mode. The pattern of the region is irradiated with the beam of gallium ions continuously for a predetermined period of time and is gradually sputtered with ions and is finally cut.

Third, a description will be given of the use and operation of the apparatus in the case when a new electrically conductive pattern is to be formed.

The specimen plate 6 is so moved that the SIM image, which includes the region where a conductive pattern to be formed is located, is displayed on the display 21 in a manner as mentioned above, and the object lens 4 adjusts the focus. Relying upon the data base related to the position coordinates and sizes of the pattern that have been stored in the disc 23 in advance, the position and size of a conductive pattern that is to be newly formed are input to the sputter/assist control unit 17 through the keyboard 22. The sputter/assist control unit 17 gives instruction to the irradiation position control unit 16 such that a region corresponding to that where the pattern is to be newly formed in the image displayed on the display 21 is correctly scanned by the gallium ion beam for a predetermined period of time. The irradiation position control unit 16 which has received the instruction sends a control signal to the scan control unit 14 so that a predetermined scanning voltage is applied to the deflecting electrodes 3 in the second scanning mode. Unlike the second case where the pattern was sputtered, the sputter/assist control unit 17 sends an instruction to the assist gas control unit 20 in order to form a new electrically conductive pattern. A gas such as pyrene ($C_{16}H_{10}$) generated by heating the gas source 11 is directed from the gas gun 9-2 through needle valve 10-2 onto the specimen 5 at a position on which the gallium ion beam is falling. The pyrene gas is decomposed by the gallium ion beam into electrically conductive carbon having a strong adhering force, which is then formed as a new electrically conductive pattern at the region that was scanned with the gallium ion beam.

The needle valve 10-2 is closed when the assist gas is not supplied from the gas source 11 to the gas gun 9-2 (e.g., first and second cases). As required, furthermore, the needle valve is used to control the amount of the gas that is supplied. It is also possible to use a molybdenum compound gas, an aluminum compound gas or a chromium compound gas, instead of the pyrene gas, from the gas gun 9-2 onto the position on which the gallium ion beam is falling, in order to form a new conductive pattern of an electrically conductive substance, to accomplish the electric connection among the patterns maintaining the sizes of the order of submicrons.

FIG. 4 shows an SEM image (secondary electron image) in which a pattern of an LSI is cut at a portion designated at 1. The LSI shown in FIG. 4 includes a conductive wiring pattern as indicated by hatched lines which is covered with a passivation film (protection film) having a thickness of several thousand angstroms. Namely, FIG. 4 shows a pattern formed by tracing the secondary electron image (SEM image) obtained by irradiating the passivation film with an electron ray. Therefore, a portion of the pattern designated at 1 is cut by sputtering the passivation film with the gallium ion beam and then sputtering said pattern. By sputtering the specimen 5 with a beam of heavy ions such as gallium ions, a tiny pattern covered with the passivation film can be easily cut.

FIG. 5 shows an SEM image in which patterns constituting the LSI are electrically connected together using electrically conductive patterns that are newly formed in shapes as designated at 2, 3, 4. The patterns 2, 3, 4 indicated by hatched lines are comprised of, for example, electrically conductive carbon films formed by decomposing the assist gas by directing the assist gas (e.g., pyrene gas as mentioned earlier) onto the regions that are to be connected while these regions are being irradiated with the gallium ion beam. By directing the assist gas while irradiating the regions with a beam of heavy ions such as gallium ions, electrically conductive tiny patterns can be newly and easily formed on the surface of the specimen 5 to accomplish the electric connection.

According to the present invention as described above (FIGS. 3, 4 and 5), the pattern is directly cut by the irradiation with an ion beam, and a gas is directed while the pattern is being irradiated with the ion beam to newly form an electrically conductive pattern. Therefore, the patterns can be electrically connected directly, making it easy to locally cut tiny patterns and to accomplish the electric connection. In particular, the invention makes it possible to locally cut the pattern and to accomplish the electric connection even in the regions of sizes of the order of submicrons that are beyond the limit which is imposed when light, such as laser beam light is used.

What is claimed is:

1. Apparatus for forming laminated conductive and insulative films on a specimen, comprising: means defining a specimen chamber for receiving a specimen; irradiating means for irradiating the specimen in the specimen chamber with a focused ion beam; scanning means selectively operable in a first mode to scan the focused ion beam over the surface of the specimen to cause the specimen to emit charged particles characteristic of a property of the specimen surface and selectively operable in a second mode to repeatedly scan the focused ion beam over a designated treatment area of the surface of the specimen; detecting means for detecting the charged particles emitted by the irradiated specimen and producing output signals representative of a characteristic of the specimen surface; imaging means responsive to the output signals for producing a visible image representative of the surface of the specimen to thereby enable an operator to view the image and select designated treatment areas on the specimen surface; means for producing a first compound vapor containing depositable conductive material which, when irradiated with the focused ion beam at the surface of the specimen, will deposit on the specimen surface as a conductive film; means for producing a second compound vapor containing depositable insulative material which, when irradiated with the focused ion beam at the surface of the specimen, will deposit on the specimen surface as an insulative film; first directing means selectively operable to direct the first compound vapor in the form of a vapor stream onto a designated treatment area of the specimen surface to form a conductive film at the said designated treatment area while the same is being irradiated with the focused ion beam; second directing means selectively operable to direct the second compound vapor in the form of a vapor stream onto a designated treatment area of the specimen surface to form an insulative film at the said designated treatment area while the same is being irradiated with the focused ion beam; and control means for selectively operating the scanning means in the first and second modes and for selectively operating the first and second directing means to effect the formation of laminated conductive and insulative films on the specimen surface.

2. Apparatus according to claim 1; wherein the control means includes means for selectively operating the scanning means in the second mode concurrently with the operation of the first directing means to thereby form a conductive film on a selected designated treatment area of the specimen surface.

3. Apparatus according to claim 2; wherein the control means includes means for selectively operating the scanning means in the second mode concurrently with the operation of the second directing means, and after formation of the conductive film, to thereby form an insulative film over at least a portion of the previously formed conductive film.

4. Apparatus according to claim 1, wherein the control means includes means for selectively operating the scanning means in the second mode concurrently with the operation of the second directing means to thereby form an insulative film on a selected designated treatment area of the specimen surface.

5. Apparatus according to claim 4; wherein the control means includes means for selectively operating the scanning means in the second mode concurrently with the operation of the first directing means, and after formation of the insulative film, to thereby form a conductive film over at least a portion of the previously formed insulative film.

6. Apparatus according to claim 1; wherein the control means includes means for selectively operating the scanning means in the second mode without operation of the first and second directing means to thereby sputter a selected designated treatment area of the specimen surface with the repeatedly scanning focused ion beam.

* * * * *